US010216372B1

(12) United States Patent
Kachmar et al.

(10) Patent No.: US 10,216,372 B1
(45) Date of Patent: Feb. 26, 2019

(54) AUTOMATIC IMPORT TO A GRAPHICAL MODEL

(71) Applicant: The MathWorks, Inc., Natick, MA (US)

(72) Inventors: Mazen A. Kachmar, Norwood, MA (US); Witold Robert Jachimczyk, Sutton, MA (US); Donald Paul Orofino, II, Sudbury, MA (US)

(73) Assignee: The MathWorks, Inc., Natick, MA (US)

( * ) Notice: Subject to any disclaimer, the term of this patent is extended or adjusted under 35 U.S.C. 154(b) by 481 days.

(21) Appl. No.: 13/888,788

(22) Filed: May 7, 2013

Related U.S. Application Data

(63) Continuation of application No. 11/005,954, filed on Dec. 6, 2004, now abandoned.

(51) Int. Cl.
| G06F 8/34 | (2018.01) |
| G06F 8/35 | (2018.01) |
| G06F 8/36 | (2018.01) |
| G06F 17/50 | (2006.01) |
| G06F 3/0481 | (2013.01) |

(Continued)

(52) U.S. Cl.
CPC .......... *G06F 3/0484* (2013.01); *G06F 3/0486* (2013.01); *G06F 3/04817* (2013.01); *G06F 8/34* (2013.01); *G06F 8/35* (2013.01); *G06F 8/36* (2013.01); *G06F 17/50* (2013.01); *G06F 17/505* (2013.01); *G06F 17/5027* (2013.01); *G06F 17/5031* (2013.01); *G06F 17/5036* (2013.01);

(Continued)

(58) Field of Classification Search
CPC ............... G06F 3/0486; G06F 3/04817; G06F 8/34–8/36; G06F 17/50; G06F 17/022; G06F 17/5027; G06F 17/5031; G06F 17/5036; G06F 17/5045; G06F 17/505; G06F 17/5054; Y10S 715/967
See application file for complete search history.

(56) References Cited

U.S. PATENT DOCUMENTS 5,157,763 A * 10/1992 Peters .................. G06F 3/0481
715/212
5,287,447 A * 2/1994 Miller .................. G06F 9/4443
715/804

(Continued)

FOREIGN PATENT DOCUMENTS

EP 0558224 A1 * 9/1993 ........... G06F 3/0481

OTHER PUBLICATIONS

Ćosić, Krešimir, et al. "Design and implementation of a hardware-in-the-loop simulator for a semi-automatic guided missile system." Simulation Practice and Theory 7.2 (1999): 107-123.*

(Continued)

*Primary Examiner* — Nicholas Klicos
(74) *Attorney, Agent, or Firm* — Harrity & Harrity, LLP

(57) ABSTRACT

A method and apparatus for retrieving selected information in a graphical model environment originates with the provision of the graphical model environment. The selected information is selected by, or provided to, a block diagram simulation application operating the graphical model environment. The selected information can be in the form of data or a reference to data. The selected information is automatically incorporated into the graphical model environment.

21 Claims, 4 Drawing Sheets

(51) Int. Cl.
  *G06F 3/0486* (2013.01)
  *G06F 3/0484* (2013.01)
(52) U.S. Cl.
  CPC ...... *G06F 17/5045* (2013.01); *G06F 17/5054* (2013.01)

(56) References Cited

U.S. PATENT DOCUMENTS

| | | | |
|---|---|---|---|
| 5,291,587 A | 3/1994 | Kodosky et al. | |
| 5,301,336 A | 4/1994 | Kodosky et al. | |
| 5,325,481 A | 6/1994 | Hunt | |
| 5,553,227 A | 9/1996 | Berry | |
| 5,566,295 A * | 10/1996 | Cypher | G06F 17/5009 703/13 |
| 5,576,946 A | 11/1996 | Bender et al. | |
| 5,598,524 A * | 1/1997 | Johnston, Jr. | G06F 3/0486 715/769 |
| 5,619,639 A * | 4/1997 | Mast | G06F 9/4443 715/798 |
| 5,664,129 A | 9/1997 | Futatsugi et al. | |
| 5,734,863 A | 3/1998 | Kodosky et al. | |
| 5,734,905 A * | 3/1998 | Oppenheim | 719/315 |
| 5,742,286 A * | 4/1998 | Kung et al. | 715/839 |
| 5,760,788 A | 6/1998 | Chainini et al. | |
| 5,831,611 A * | 11/1998 | Kennedy et al. | 715/763 |
| 5,867,144 A * | 2/1999 | Wyard | G06F 3/0486 715/255 |
| 5,909,214 A * | 6/1999 | Consolatti et al. | 715/764 |
| 5,911,070 A * | 6/1999 | Solton | G06F 8/34 717/105 |
| 5,950,190 A * | 9/1999 | Yeager | G06F 17/30572 |
| 5,966,126 A * | 10/1999 | Szabo | G06F 9/4443 707/E17.082 |
| 5,966,532 A * | 10/1999 | McDonald | G06F 8/34 707/999.101 |
| 5,966,717 A * | 10/1999 | Sass | G06F 17/30569 |
| 6,002,402 A * | 12/1999 | Schacher | G06F 3/0481 715/810 |
| 6,053,951 A | 4/2000 | McDonald et al. | |
| 6,113,649 A * | 9/2000 | Govindaraj | G06F 8/34 717/113 |
| 6,131,184 A * | 10/2000 | Weeren | G06F 8/34 715/967 |
| 6,154,875 A * | 11/2000 | Tanaka | G06F 8/34 717/107 |
| 6,182,278 B1 | 1/2001 | Hamada et al. | |
| 6,216,141 B1 * | 4/2001 | Straub | G06F 9/543 709/203 |
| 6,216,261 B1 | 4/2001 | Mitchell | |
| 6,233,726 B1 * | 5/2001 | Bowman | G06F 8/20 707/999.102 |
| 6,240,465 B1 * | 5/2001 | Leach | G06F 9/443 707/999.103 |
| 6,252,591 B1 * | 6/2001 | Dockweiler | G06F 9/4443 715/744 |
| 6,282,699 B1 * | 8/2001 | Zhang | G06F 8/34 715/967 |
| 6,337,696 B1 | 1/2002 | Lindhorst et al. | |
| 6,366,300 B1 | 4/2002 | Ohara et al. | |
| 6,490,493 B1 * | 12/2002 | Dharnipragada | G05B 19/41885 700/105 |
| 6,535,230 B1 * | 3/2003 | Celik | G06F 3/0486 715/769 |
| 6,624,909 B1 * | 9/2003 | Czyszczewski | H04N 1/00209 358/1.15 |
| 6,636,250 B1 * | 10/2003 | Gasser | G06F 3/0481 715/733 |
| 6,684,385 B1 * | 1/2004 | Bailey | G06F 8/34 717/105 |
| 6,701,513 B1 * | 3/2004 | Bailey | G06F 8/34 715/967 |
| 6,754,697 B1 * | 6/2004 | Berstis | G06F 17/30876 707/999.002 |
| 6,763,515 B1 * | 7/2004 | Vazquez | G06F 8/34 715/967 |
| 6,792,595 B1 * | 9/2004 | Storistenau | G06F 8/33 345/650 |
| 6,803,929 B2 * | 10/2004 | Hinegardner | G06F 3/0481 715/748 |
| 6,851,107 B1 | 2/2005 | Coad et al. | |
| 6,912,692 B1 * | 6/2005 | Pappas | G06F 9/45512 715/762 |
| 7,000,190 B2 | 2/2006 | Kudukoli et al. | |
| 7,030,890 B1 * | 4/2006 | Jouet | G06F 9/4443 345/589 |
| 7,062,718 B2 * | 6/2006 | Kodosky | G05B 19/0426 703/21 |
| 7,079,141 B2 | 7/2006 | Vazquez et al. | |
| 7,120,876 B2 | 10/2006 | Washington et al. | |
| 7,134,086 B2 * | 11/2006 | Kodosky | 715/763 |
| 7,159,183 B1 | 1/2007 | Kudukoli et al. | |
| 7,200,838 B2 * | 4/2007 | Kodosky | G06F 8/34 715/762 |
| 7,210,117 B2 * | 4/2007 | Kudukoli | G06F 8/34 715/762 |
| 7,243,334 B1 * | 7/2007 | Berger | G06F 8/38 705/30 |
| 7,275,235 B2 | 9/2007 | Molinari et al. | |
| 7,322,023 B2 | 1/2008 | Shulman et al. | |
| 7,331,019 B2 | 2/2008 | Ananth et al. | |
| 7,331,039 B1 | 2/2008 | Yip et al. | |
| 7,337,409 B2 * | 2/2008 | Doblmayr | G06F 3/0486 715/769 |
| 7,340,721 B1 | 3/2008 | Bailey | |
| 7,370,281 B2 * | 5/2008 | Weber | G06F 3/0486 715/769 |
| 7,370,315 B1 | 5/2008 | Lovell et al. | |
| 7,376,904 B2 * | 5/2008 | Cifra | G05B 19/0426 715/762 |
| 7,392,507 B2 | 6/2008 | Kolawa et al. | |
| 7,428,737 B1 * | 9/2008 | Borghesani | G06F 9/44521 717/163 |
| 7,451,403 B1 | 11/2008 | Srinivasan et al. | |
| 7,650,576 B2 | 1/2010 | Becerra, Jr. | |
| 7,676,790 B1 * | 3/2010 | Hsu | G06F 9/451 717/106 |
| 2001/0020291 A1 * | 9/2001 | Kudukoli et al. | 717/1 |
| 2002/0033844 A1 * | 3/2002 | Levy | G06F 21/10 715/744 |
| 2002/0083413 A1 | 6/2002 | Kodosky et al. | 717/109 |
| 2002/0091700 A1 * | 7/2002 | Steele | G06F 17/30958 |
| 2002/0095658 A1 * | 7/2002 | Shulman | G06F 8/33 717/111 |
| 2002/0113816 A1 * | 8/2002 | Mitchell | G06F 3/0481 715/734 |
| 2003/0007005 A1 * | 1/2003 | Kandogan | 345/763 |
| 2003/0016234 A1 * | 1/2003 | Mani | G06F 17/5009 345/621 |
| 2003/0034998 A1 * | 2/2003 | Kodosky et al. | 345/736 |
| 2003/0037316 A1 * | 2/2003 | Kodosky et al. | 717/127 |
| 2003/0037322 A1 * | 2/2003 | Kodosky et al. | 717/162 |
| 2003/0058280 A1 | 3/2003 | Molinari et al. | |
| 2003/0071845 A1 * | 4/2003 | King | G06F 9/542 715/764 |
| 2003/0076355 A1 * | 4/2003 | Kodosky | 345/763 |
| 2003/0154191 A1 * | 8/2003 | Fish | G06F 8/34 |
| 2003/0167327 A1 * | 9/2003 | Baldwin | H04L 67/36 709/225 |
| 2003/0184580 A1 * | 10/2003 | Kodosky et al. | 345/734 |
| 2004/0056896 A1 * | 3/2004 | Doblmayr et al. | 345/734 |
| 2004/0066410 A1 * | 4/2004 | Lindhorst | G06F 8/34 715/769 |
| 2004/0207659 A1 * | 10/2004 | Goodman | G06F 9/451 715/762 |
| 2004/0221238 A1 * | 11/2004 | Cifra et al. | 715/762 |
| 2005/0149855 A1 * | 7/2005 | Loo | H04M 3/5133 715/255 |

(56) References Cited

U.S. PATENT DOCUMENTS

| | | | |
|---|---|---|---|
| 2006/0080432 A1* | 4/2006 | Spataro | H04L 12/1831 709/224 |
| 2006/0139372 A1* | 6/2006 | Orofino, II | G06T 11/60 345/629 |
| 2006/0206827 A1* | 9/2006 | DeWitt | G06F 9/4443 715/762 |
| 2007/0288885 A1* | 12/2007 | Brunel | G06F 8/10 717/104 |
| 2009/0172101 A1* | 7/2009 | Arthursson | G06F 3/0486 709/205 |
| 2009/0327953 A1* | 12/2009 | Honkala | G06F 3/04817 715/804 |

OTHER PUBLICATIONS

Hanzalek, Zdenek, et al. "Hardware in the Loop Simulation of FBW components." AIAA Modeling and Simulation Technologies Conference. 2009.*

Co-pending U.S. Appl. No. 11/005,954, filed Dec. 6, 2004, entitled "Automatic Import to a Graphical Model," by Kachmar et al., 27 pages.

* cited by examiner

AUTOMATIC IMPORT TO A GRAPHICAL MODEL

RELATED APPLICATION

This application is a continuation of U.S. application Ser. No. 11/005,954, filed Dec. 6, 2004, the disclosure of which is incorporated herein by reference.

FIELD OF THE INVENTION

The present invention relates to a system and method suitable for accepting values from a data source, and more particularly to a mechanism that enables the incorporation of data into a graphical modeling environment upon action of a drag-and-drop operation.

BACKGROUND OF THE INVENTION

Various classes of graphical models describe computations that can be performed on computational hardware, such as a computer, microcontroller, FPGA, and custom hardware. Classes of such graphical models include time-based block diagrams, such as those found within Simulink®, from The Math Works, Inc. of Natick, Mass., state-based and flow diagrams, such as those found within Stateflow®, from The Math Works, Inc. of Natick, Mass., data-flow diagrams, circuit diagrams, and software diagrams, such as those found in the Unified Modeling Language. A common characteristic among these various forms of graphical models is that they define semantics on how to execute the model.

Historically, engineers and scientists have utilized time-based graphical models in numerous scientific areas such as Feedback Control Theory and Signal Processing to study, design, debug, and refine dynamic systems. Dynamic systems, which are characterized by the fact that their behaviors change over time, are representative of many real-world systems. Time-based graphical modeling has become particularly attractive over the last few years with the advent of software packages, such as Simulink®. Such packages provide sophisticated software platforms with a rich suite of support tools that makes the analysis and design of dynamic systems efficient, methodical, and cost-effective.

A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), bio-chemical systems (gene expression, protein pathways), weather and climate pattern systems, etc. Examples of man-made or engineered dynamic systems include: a bouncing ball, a spring with a mass tied on an end, automobiles, airplanes, control systems in major appliances, communication networks, audio signal processing, nuclear reactors, a stock market, etc. Professionals from diverse areas such as engineering, science, education, and economics build mathematical models of dynamic systems in order to better understand system behavior as it changes with the progression of time. The mathematical models aid in building "better" systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve an educational purpose of educating others on the basic principles governing physical systems. The models and results are often used as a scientific communication medium between humans. The term "model-based design" is used to refer to the use of graphical models in the development, analysis, and validation of dynamic systems.

Dynamic systems are typically modeled in simulation environments as sets of differential, difference, and/or algebraic equations. At any given instant of time, these equations may be viewed as relationships between the system's output response ("outputs"), the system's input stimuli ("inputs") at that time, the current state of the system, the system parameters, and time. The state of the system may be thought of as a numerical representation of the dynamically changing configuration of the system. For instance, in a physical system modeling a simple pendulum, the state may be viewed as the current position and velocity of the pendulum. Similarly, a signal-processing system that filters a signal would maintain a set of previous inputs as the state. The system parameters are the numerical representation of the static (unchanging) configuration of the system and may be viewed as constant coefficients in the system's equations. For the pendulum example, a parameter is the length of pendulum and for the filter example; a parameter is the values of the filter taps.

Generally, graphical analysis and simulation methods, such as the block diagram method, are used in modeling for design, analysis, and synthesis of engineered systems. The visual representation allows for a convenient interpretation of model components and structure and provides a quick intuitive notion of system behavior.

During the course of modeling and simulation, there are often different requirements relating to data input into the model. Some input may be required of the user operating the model. Other input may be stored prior to operating the model in a manner that enables the model to access the input as necessary. However, for the initial indication of where selected information is located, and to set up a link or provide selected information efficiently, there is no convenient mechanism. A user has to access the model and, knowing information such as an electronic address, manually enter the address information to provide a link to selected information. Such incorporation of selected information is not automated in the existing art.

SUMMARY OF THE INVENTION

There is a need for a system and method for automatically incorporating selected information into a graphical model within a block diagram modeling and/or simulation environment. The present invention is directed to a solution to address this need.

In accordance with one embodiment of the present invention, in a graphical model environment, a method of retrieving selected information includes selecting one of selected information and a reference to the selected information for incorporation. The at least one of the selected information and the reference to the selected information are automatically incorporated into the graphical model environment, such that a graphical representation is created in the graphical model environment referencing the at least one of the selected information and the reference to the selected information.

In accordance with aspects of the present invention, the graphical model environment includes a graphical representation of a model simulation. The selected information and the reference to the selected information can be disposed in a remote location relative to the graphical model environment. The graphical model environment can be disposed in a first pane, and at least one of the selected information and the reference to the selected information can be disposed in a second pane.

In accordance with further aspects of the present invention, the step of automatically incorporating includes identifying one or more properties of at least one of the selected information and the reference to the selected information; comparing the one or more properties to a preference; and implementing a routine to incorporate at least one of the selected information and the reference to the selected information into the graphical model environment. The one or more properties can include at least one of a file name, a file type, a file location, a reference name, a reference type, and a reference location. The preference can include instructions provided by a user providing parameters for the incorporation, a database, and/or a default database.

In accordance with further aspects of the present invention, the method further includes querying a user for instruction during the automatic incorporation of at least one of the selected information and the reference to the selected information into the graphical model environment.

In accordance with further aspects of the present invention, at least one of the selected information and the reference to the selected information can be a data source, a function, an output sink, and/or can required at least one input.

In accordance with further aspects of the present invention, the step of selecting at least one of the selected information and the reference to the selected information for incorporation can include a user dragging and dropping an iconic representation of one of at least one of the selected information and the reference to the selected information into the graphical model environment, and/or a user cutting and pasting an iconic representation of at least one of the selected information and the reference to the selected information into the graphical model environment.

In accordance with further aspects of the present invention, a configuration of a block in the simulation environment incorporating at least one of the selected information and the reference to the selected information can be periodically automatically updated.

In accordance with further aspects of the present invention, the step of automatically incorporating the reference to at least one of the selected information and the reference to the selected information into the graphical model environment includes creating a block supporting at least one of the selected information and the reference to the selected information.

In accordance with one example embodiment of the present invention, in a graphical model environment, a system for retrieving selected information includes an incorporation mechanism for selecting at least one of the selected information and a reference to the selected information for incorporation. The incorporation mechanism automatically incorporates the selected at least one of the selected information and the reference to the selected information into the graphical model environment, in a manner such that a graphical representation is created in the graphical model environment referencing the at least one of the selected information and the reference to the selected information.

In accordance with one example embodiment of the present invention, a medium for use in a simulation environment on an electronic device is provided. The medium holds instructions executable using the electronic device for performing a method of retrieving selected information. The method includes selecting at least one of selected information and a reference to the selected information for incorporation; and automatically incorporating at least one of the selected information and the reference to the selected information into the graphical model environment, in a manner such that a graphical representation is created in the graphical model environment referencing the at least one of the selected information and the reference to the selected information.

BRIEF DESCRIPTION OF THE DRAWINGS

The present invention will become better understood with reference to the following description and accompanying drawings, wherein.

DETAILED DESCRIPTION

Figure 1:
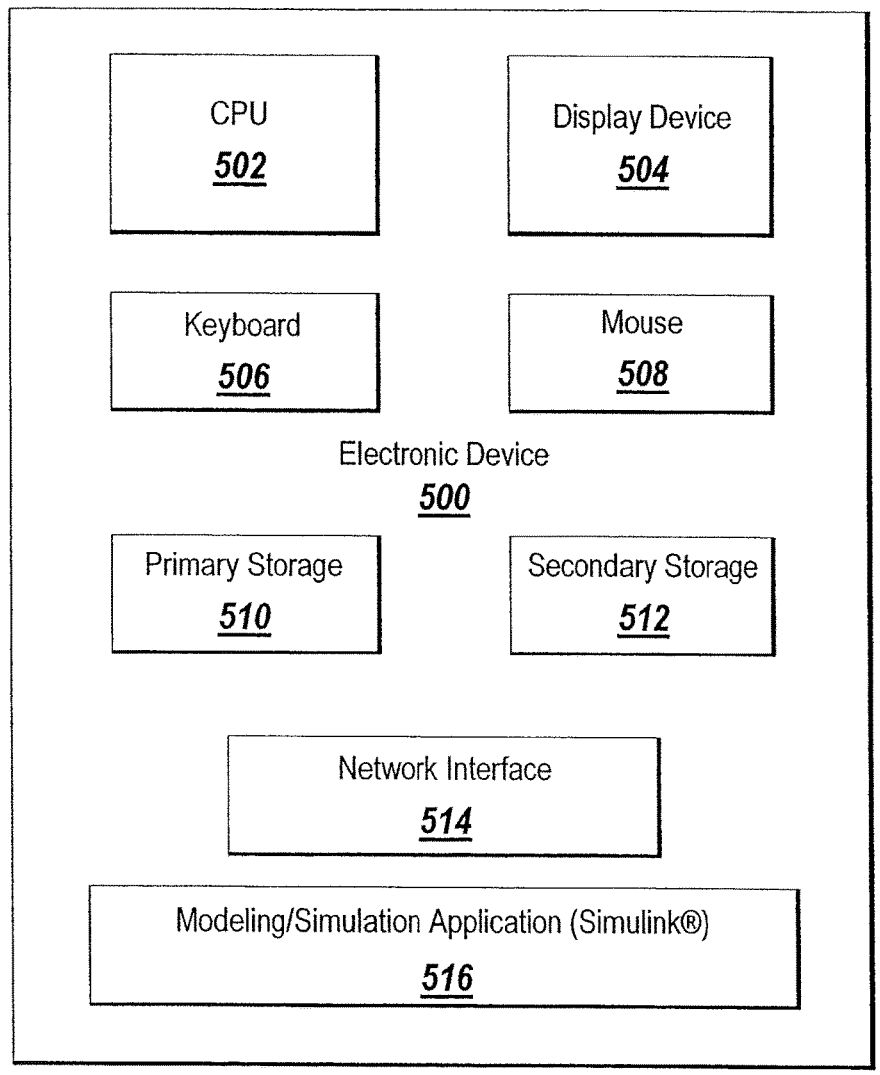
FIG. 1 is a diagrammatic illustration of an electronic device that can be utilized to execute a method performed in an embodiment of the present invention.

An illustrative embodiment of the present invention relates to a system and method wherein a graphical model, such as a block diagram simulation, is configured to accept values from a data source or other data representation of selected information having a textual or graphical representation suitable for drag-and-drop operation. The data source can be, for example, a data file, a data stream, or a link to a data location. The graphical model is automatically modified by dragging the data representation (textual or graphical) such as an icon, and dropping the icon on a work area of the graphical model. In response, the graphical model automatically adds a block (or other graphical representation) to the graphical model and configures the block appropriately. The specific type of block added to the graphical model depends in part on the type of the data source accessed. Additional parameters of the block can also be set, either with default values, programmatically determined values, or through input by the user.

FIGS. 1 through 5, wherein like parts are designated by like reference numerals throughout, illustrate example embodiments of a system and method for automatically incorporating selected information into a graphical model according to the present invention. Although the present invention will be described with reference to the example embodiments illustrated in the figures, it should be understood that many alternative forms can embody the present invention. One of ordinary skill in the art will additionally appreciate different ways to alter the parameters of the embodiments disclosed in a manner still in keeping with the spirit and scope of the present invention.

FIG. 1 illustrates one example embodiment of an electronic device 500 suitable for practicing the illustrative embodiments of the present invention. The electronic device 500 is representative of a number of different technologies, such as personal computers (PCs), laptop computers, workstations, personal digital assistants (PDAs), Internet appliances, cellular telephones, and the like. In the illustrated embodiment, the electronic device 500 includes a central processing unit (CPU) 502 and a display device 504. The display device 504 enables the electronic device 500 to communicate directly with a user through a visual display. The electronic device 500 further includes a keyboard 506 and a mouse 508. Other potential input devices not depicted include a stylus, trackball, joystick, touch pad, touch screen, and the like. The electronic device 500 includes primary storage 510 and secondary storage 512 for storing data and instructions. The storage devices 510 and 512 can include such technologies as a floppy drive, hard drive, tape drive, optical drive, read only memory (ROM), random access memory (RAM), and the like. Applications such as browsers, JAVA virtual machines, and other utilities and applications can be resident on one or both of the storage devices 510 and 512. The electronic device 500 can also include a network interface 514 for communicating with one or more electronic devices external to the electronic device 500 depicted. A modem is one form of network interface 514 for establishing a connection with an external electronic device or network. The CPU 502 has either internally, or externally, attached thereto one or more of the aforementioned components. In addition to applications previously mentioned, modeling applications, such as Simulink® 516, can be installed and operated on the electronic device 500.

It should be noted that the electronic device 500 is merely representative of a structure for implementing the present invention. However, one of ordinary skill in the art will appreciate that the present invention is not limited to implementation on only the described device 500. Other implementations can be utilized, including an implementation based partially or entirely in embedded code, where no user inputs or display devices are necessary. Rather, a processor can communicate directly with another processor or other device.

Turning now to example embodiments of the present invention, the method and system of the present invention operate in a block diagram simulation environment, such as that of Simulink®. The block diagram simulation environment is otherwise referred to herein as the graphical model. One of ordinary skill in the art will appreciate that there are a number of different graphical modeling and simulation applications that make general use of blocks or other graphical representations to model or simulate conditions, events, designs, operations, and the like. Accordingly, the present invention is intended for use on all such graphical applications.

Figure 2:
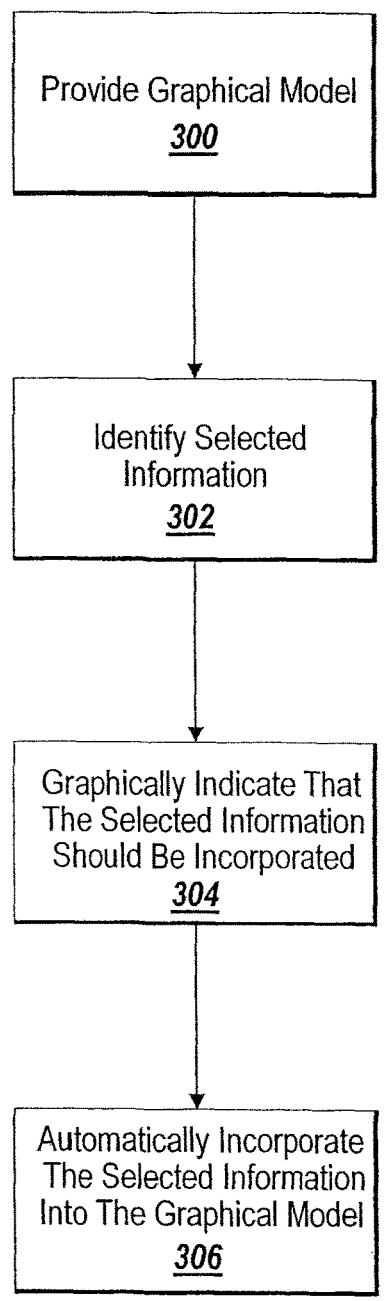
FIG. 2 is a flowchart illustrating a method of automatically incorporating selected information into a graphical model, in accordance with one embodiment of the present invention.

The present invention is generally directed to a system and method for retrieving selected information and incorporating the selected information into the graphical model. FIG. 2 is a flowchart illustrating the basic steps of the incorporation of selected information. A graphical model is provided (step 300). The graphical model can be a number of different modeling and/or simulation applications, as discussed previously. The selected information is identified for incorporation into the graphical model (step 302). A user graphically indicates that the selected information should be incorporated into the graphical model (step 304). The user can graphically indicate that the selected information should be incorporated into the graphical model using a number of different methods. For example, the user can click on the graphical or textual representation of the selected information to select the selected information, drag the graphical or textual representation over to the graphical model, and drop the graphical or textual representation of the selected information into the model. This is known as a drag-and-drop operation. Alternatively, the user can otherwise select or highlight the graphical or textual representation of the selected information, execute either a "cut" or "copy" operation, and then "paste" the graphical or textual representation of the selected information into the graphical model. One of ordinary skill in the art will appreciate that the drag-and-drop operation, and the cut-and-paste operation, are merely two examples of a user graphically indicating the selection and transfer of the selected information from one location to another. Accordingly, the present invention is not limited to the drag-and-drop or cut-and-paste operations, but instead is intended to apply to any such graphical methods of identifying a connection to data or data references.

As referred to herein, the selected information, and the reference to the selected information (such as an icon or other representation) are intended to include both singular and plural forms. More specifically, the selected information can be a single input item, or a collection or plurality of input items. Likewise, the reference to selected information can be both a single reference to a single input or a plurality of inputs, as well as a plurality of references to inputs.

Furthermore, in the embodiments described herein, it is assumed that the origin of the selected information is in a location discrete from that of the graphical model. The selected information can be, for example, in a remote location relative to the graphical model, such as a file location on the same electronic device that is not a part of the graphical model; in a file location on a different electronic device connected through a network to the electronic device 500 hosting the graphical model; in a file location on a remote hardware device physically, electronically, or wirelessly connected with the electronic device 500 hosting the graphical model; or in another file location that can in some manner communicate with the graphical model in a manner that would allow the transfer of information. Accordingly, as utilized herein, the phrase "selected information" is intended to refer to a number of different forms of information, including but not limited to data, functions, inputs, outputs, tables, data structures, databases, links, sources, sinks, and/or references to any of the aforementioned forms of information.

The method continues by automatically incorporating the selected information into the graphical model (step 306). The automatic incorporation of the selected information can occur in a number of different embodiments. The selected information itself can have two basic forms. A first embodiment of the selected information is one of a data file, or other actual file, containing the selected information. A second embodiment of the selected information is one of a reference to a data file, or other file, containing the selected information. In the case of the data file, or other actual file, the information contained in the file can be copied or cut and paste into the graphical model. In such an embodiment the result is that the selected information is disposed within the graphical model. The graphical model need not access a remote file or remote location to obtain the selected information. In the case of the reference to the data file, or other file, a link to the file is what is actually deposited into the graphical model. Accordingly, when the graphical model requires the selected information, the graphical model must appropriately access the link to the remote location containing the selected information. The link can be, for example, a stream of data, a hyperlink to a remote location, and the like.

Figure 3:
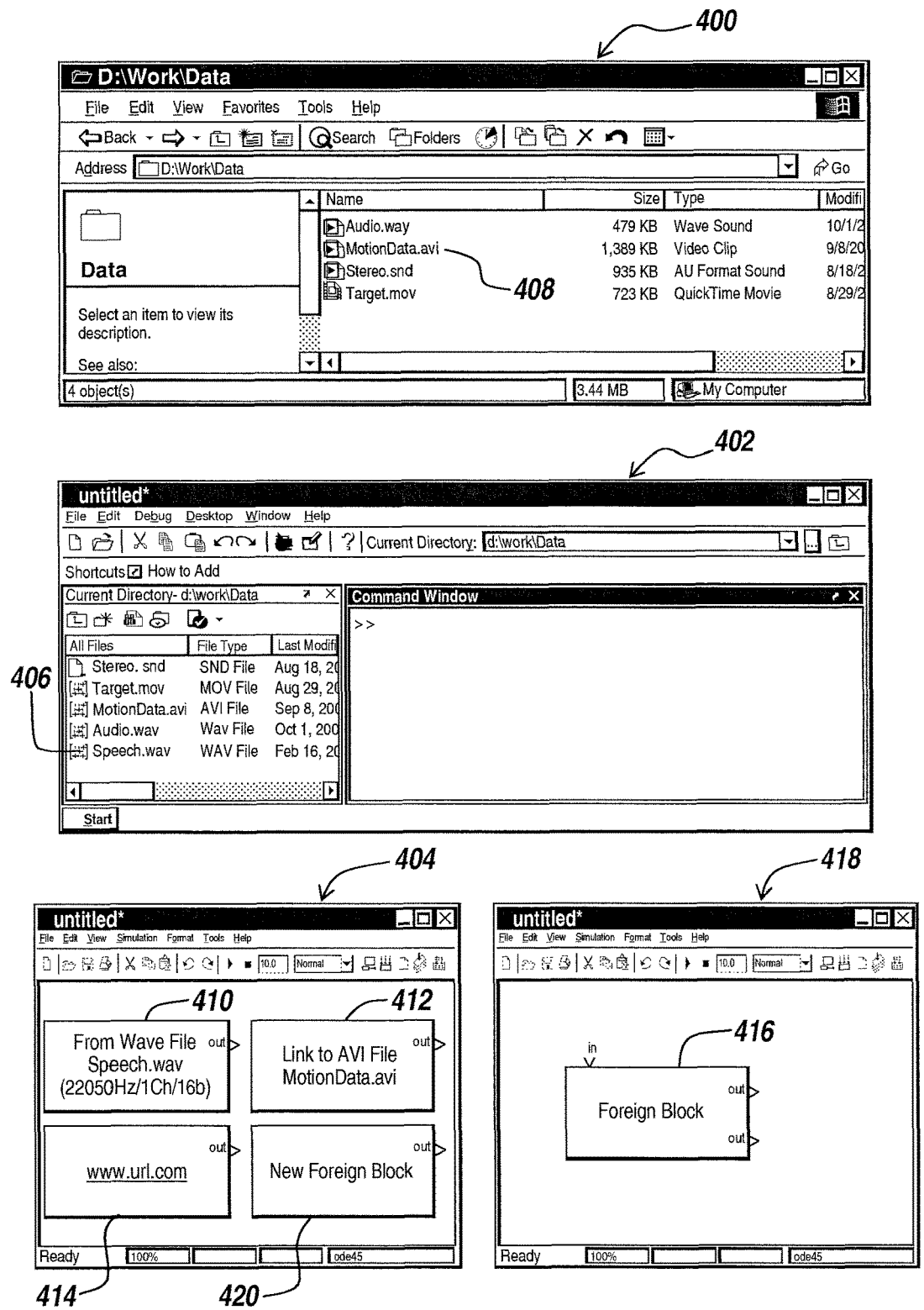
FIG. 3 is a diagrammatic illustration of the incorporation of selected information from several different sources, in accordance with aspects of the present invention.

An example embodiment illustrating the discrete location of the selected information from the location of the graphical model is illustrated in FIG. 3. Three different windows are shown in this figure. A Windows® Explorer window is provided as file directory window 400, a MATLAB® window is provided as application window 402, and a Simulink® window is provided as graphical model window 404. The Simulink® window 404 is representative of the graphical model as described herein. The user can select a file from either (or both) of the file directory window 400 and the application window 402. It should again be noted that the windows provided in the illustrations are merely exemplar of windows that can display images relating to the selected information. Other applications having windows supporting textual or graphical representations of files containing selected information can be utilized in accordance with the present invention as described herein. The file browser may be supplied by the operating system of the computer, or by another application or program. Accordingly, the present invention is not limited to use only with Windows® or MATLAB®.

In the example embodiment illustrated, the user has selected a Speech.wav file 406 from the application window 402 and drag-and-dropped it into the graphical model window 404 to create block 410. In addition, the user has selected a MotionData.avi file 408 from the file directory window 400 and drag-and-dropped it into the graphical model window 404 to create block 412. In each instance, the user can also have performed a select, cut, and past operation to transfer the data files to the graphical model window 404. In addition, it should be noted that the block 410 is representative of a data file that has actually been incorporated into the graphical model shown in the graphical model window 404. Whereas, the block 412 is representative of a link to a data file; thus, the graphical model has incorporated a link to the MotionData.avi file 408. In both instances, a block was created (block 410 and block 412) in the graphical model.

Instead of a block, such as block 410 and block 412, the graphical model may be configured in other ways to provide input from data files. An explicit or virtual connection from the data file to an input port, to a data line, or to another appropriate input that accepts data can be invoked using the drag-and-drop or other data transfer operation. In all instances, the graphical model automatically opens an appropriate component and populates that component with details from the data file, possibly including the directory path to the file, and other data file specific information.

As previously mentioned, the present invention is not limited to inputting data files, and links to data files. The selected information can include data files, links to data files, as well as a source of streaming data, a hypertext link, or some other location designation. Block 414, for example, is representative of a URL from a web browser that has been drag-and-dropped into the graphical model of the graphical model window 404. Thus hypertext links, and other links, can be transformed into blocks of the graphical model. Another example is the drag-and-drop of an executable file that effects the transfer of data from a data acquisition device, such as a device driver application. All such files and links to files are anticipated by the features of the present invention.

Thus, the selected information incorporated by the operation of the present invention can originate with a data source, a function, and/or some other form of an output sink. The resulting block, such as blocks 410, 412, 414, or 420 (see below) can require one or more ports, such as the example inputs and outputs illustrated, once configured within the graphical model.

In addition, it should be noted that the drag-and-drop, or other data transfer operation, can be implemented between another graphical modeling application, such as LabView® or Hypersignal®, both from National Instruments Corporation, into the graphical model window 404. This is illustrated by a foreign graphical model window 418 containing a foreign block 416. The user can drag-and-drop the foreign block 416 to the graphical model to from a new foreign block 420, which may have one or more inputs, outputs, or other ports. Upon introduction of the new foreign block 420, the present invention automatically configures the block 420 to enable appropriate data transfer with the foreign block 416.

Figure 4:
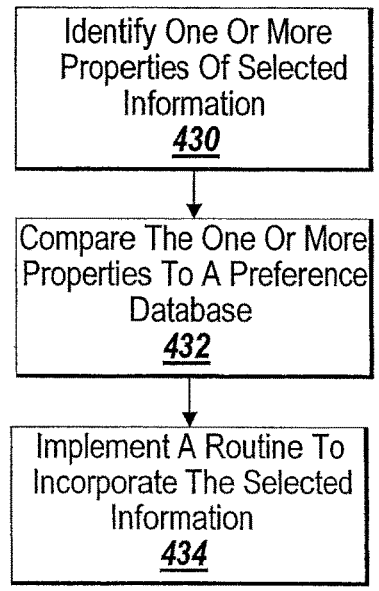
FIG. 4 is a flowchart illustrating a method of automating the incorporation of selected information, in accordance with one embodiment of the present invention.

The present invention automatically incorporates the data, function, or other information of the selected information into the graphical model. The automatic incorporation can be executed a number of different ways, including that which is illustrated in the flowchart of FIG. 4. When the selected information is introduced to the graphical model, one or more properties of the selected information are identified (step 430) accordingly to pre-selected criteria. Examples of the one or more properties include a file name, a file type, a file location, a reference name, a reference type, and a reference location.

The one or more properties is compared to a preference database (step 432) or some equivalent. The preference database can contain instructions provided by a user providing parameters for the incorporation of the selected information. Alternatively, the preference database can be a default database that contains standard instructions for the incorporation of the selected information if the user has not provided any specific incorporation instructions or preferences. In even further alternative, the preference database does not need to be a database per se, but can have a number of different formats for collecting and providing information that can be referenced and compared with the one or more properties.

Based at least in part on the information learned from the comparison with the preference database, a routine is implemented to incorporate the selected information into the graphical model (step 434).

It should be noted that at any point along the above-described method, a user can be queried for instruction during the automatic incorporation of the selected information into the graphical model. The query can take the form, for example, of a pop-up window asking a question and providing options, or a field to receive text based instruction. The query, and the entire automated process, can also incorporate the use of a GUI wizard that guides the user through the process of selected information incorporation. If at any point along the incorporation process the graphical model requires some instruction not already provided or available, such instruction can be obtained by querying the user.

One specific example of user input comes upon the formation of the block within the graphical model. Upon completion of the block, or just prior to completion of the block, the user can be queried as to additional parameters of the block, such as appearance, display, content, inputs and outputs, and the like. Such parameters can also be configured, or re-configured, by the user after the block has been formed in the graphical model in accordance with general operation of the graphical model and the application operating the model. If no user interaction is solicited, or provided, the block parameters can also be set with default values, or programmatically determined values as is understood by one of ordinary skill in the art.

It should further be noted that the incorporation of the selected information, because it is automated, can periodically automatically update a configuration of a block (e.g., block 410, 412, 414, or 420) in the graphical model incorporating the selected information.

Figure 5:
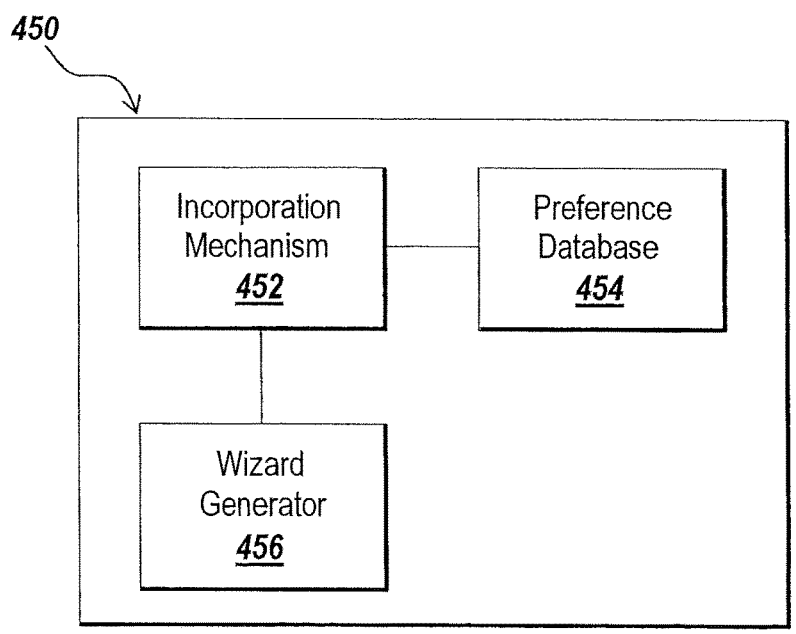
FIG. 5 is a diagrammatic illustration of a system for implementing the method of the present invention.

The method of the present invention is executed by a system for retrieving selected information, an example embodiment of which is illustrated in FIG. 5. In a block diagram simulation environment, such as the graphical model environment, a system for retrieving selected information 450 is provided. The system includes an incorporation mechanism 452. The incorporation mechanism 452 guides the selection of the selected information to be incorporated into the graphical model, and automatically incorporates the selected information.

The automatic incorporation of the selected information involves reference to a preference such as a preference database 454. The preference database can be included within the incorporation mechanism 452, or can be referenced by the incorporation mechanism 452 as illustrated.

In addition, in accordance with one example embodiment, the incorporation mechanism 452 makes use of a GUI wizard to guide a user through the incorporation process. Accordingly, a wizard generator 456 can be provided. Again, the wizard generator 456 can be provided either as a part of the incorporation mechanism 452, or it can be provided by, for example the operating system, and merely referenced by the incorporation mechanism 452.

The system for retrieving selected information 450 is illustrated as one example embodiment of the present invention. Various elements of the system for retrieving selected information 450 can reside within the system 450, or can be referenced by the system 450. In addition, the functions of each of the various elements can be provided in part or in whole as shown or by combining or referencing other components made available to the graphical model and block diagram modeling and simulation environment, such that the present invention is not limited to the specific configuration illustrated and described herein.

In accordance with the above description and the present invention, a system and method for incorporating selected information into a graphical model are provided herein. The method in a graphical model environment includes identifying the selected information in the form of a data file or a reference (singular or plural), and automatically incorporating selected information into the graphical model environment. The system and method are configured to accept values from a data, function, or other source having a textual or graphical representation suitable for drag-and-drop operation. The data, function, or other source can have a number of different embodiments. The incorporation process occurs automatically upon the introduction of the selected information, via a graphical operation such as drag-and-drop, into the graphical model. The incorporation is embodied in the form of, for example, a block in the graphical model. Additional parameters of the block can also be set, either with default values, programmatically determined values, or through input by the user.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the present invention, and exclusive use of all modifications that come within the scope of the appended claims is reserved. It is intended that the present invention be limited only to the extent required by the appended claims and the applicable rules of law.

What is claimed is:

1. A method comprising:
    receiving a request to incorporate selected information, from a location external to a graphical modeling environment, into an executable graphical model of the graphical modeling environment,
        the executable graphical model simulating, in the graphical modeling environment, a dynamic system,
        the executable graphical model including a first representation format within the graphical modeling environment,
        the selected information being represented by a second representation format, different than the first representation format, in the location external to the graphical modeling environment, and
        the receiving the request being performed by a device; and
    automatically incorporating the selected information from the location external to the graphical modeling environment into the executable graphical model, to produce a modified, executable graphical model,
        the automatically incorporating being performed by the device, and
        the automatically incorporating including:
            identifying a file type of the selected information;
            comparing the file type to a data structure including stored instructions that include parameters for incorporation of a plurality of file types into the executable graphical model;
            implementing a routine to incorporate the selected information into the executable graphical model, in a manner such that a graphical component in the first representation format in the graphical modeling environment is created in the executable graphical model that represents the selected information from the location external to the graphical modeling environment, based on comparing the file type to the data structure; and
            incorporating the graphical component into the executable graphical model, based on the routine, to produce the modified, executable graphical model,
                the graphical component being different than the selected information and being created based on the selected information or information referencing the selected information,
                the graphical component including the selected information or the information referencing the selected information, and
                the incorporating the graphical component into the executable graphical model including adding the graphical component to the executable graphical model or linking the executable graphical model to the selected information through the graphical component.

2. The method of claim 1, where the selected information includes one or more files.

3. The method of claim 2, further comprising:
receiving an indication that the selected information or a reference to the selected information is dragged and dropped into a display of the executable graphical model.

4. The method of claim 1, where the selected information comprises data, functions, inputs, outputs, tables, data structures, databases, links, sources, sinks, or a reference to data, functions, inputs, outputs, tables, data structures, databases, links, sources, or sinks.

5. The method of claim 1, further comprising:
configuring the graphical component, where configuring the graphical component comprises adding at least one port to the graphical component such that the selected information, from the location external to the graphical modeling environment, is accessible to another component of the modified, executable model via the graphical component.

6. The method of claim 1, where the executable graphical model comprises executable blocks.

7. The method of claim 1, where receiving the request includes:
receiving the request to incorporate selected information, from an application window distinct from the graphical modeling environment, into the executable graphical model,
the application window being associated with an application different than a graphical modeling application used to execute the executable graphical model.

8. A system comprising:
one or more devices, at least partially implemented in hardware, to:
receive a request to incorporate selected information, from a location external to a graphical modeling environment, into an executable graphical model of the graphical modeling environment,
the executable graphical model simulating, in the graphical modeling environment, a dynamic system,
the executable graphical model including a first representation format within the graphical modeling environment, and
the selected information being represented by a second representation format, different than the first representation format, in the location external to the graphical modeling environment; and
automatically incorporate the selected information from the location external to the graphical modeling environment into the executable graphical model, to produce a modified, executable graphical model,
when automatically incorporating, the one or more devices are to:
identify a file type of the selected information;
compare the file type to a data structure including stored instructions that include parameters for incorporation of a plurality of file types into the executable graphical model;
implement a routine to incorporate the selected information into the executable graphical model, in a manner such that a graphical component in the first representation format in the graphical modeling environment is created in the executable graphical model that represents the selected information from the location external to the graphical modeling environment, based on comparing the file type to the data structure; and
incorporate the graphical component into the executable graphical model, based on the routine, to produce the modified, executable graphical model,
the graphical component being different than the selected information and being obtained or generated based on the selected information or information referencing the selected information,
the graphical component including the selected information or the information referencing the selected information, and
where the one or more devices, when incorporating the graphical component into the executable graphical model, are to add the graphical component to the executable graphical model or link the executable graphical model to the selected information through the graphical component.

9. The system of claim 8, where the second representation format includes a textual format.

10. The system of claim 9, where the one or more devices are to:
receive an indication that the selected information or a reference to the selected information is dragged and dropped into a display of the executable graphical model.

11. The system of claim 8, where the selected information comprises data, functions, inputs, outputs, tables, data structures, databases, links, sources, sinks, or a reference to data, functions, inputs, outputs, tables, data structures, databases, links, sources, or sinks.

12. The system of claim 8, where the one or more devices are to:
configure the graphical component, where when configuring the graphical component, the one or more devices are to:
add at least one port to the graphical component such that the selected information, from the location external to the graphical modeling environment, is accessible to another component of the modified, executable model via the graphical component.

13. The system of claim 8, where the executable graphical model comprises executable blocks.

14. The system of claim 8, where, when obtaining the graphical component, the one or more devices are to create the graphical component.

15. The system of claim 8, where the one or more devices, when receiving the request, are to:
receive the request to incorporate selected information, from an application window distinct from the graphical modeling environment, into the executable graphical model,
the application window being associated with an application different than a graphical modeling application used to execute the executable graphical model.

16. A non-transitory computer-readable storage medium including instructions, the instructions comprising:
one or more instructions which, when executed by at least one processor, cause the at least one processor to:
receive a request to incorporate selected information, from a location external to a graphical modeling environment, into an executable graphical model of the graphical modeling environment,
the executable graphical model simulating, in the graphical modeling environment, a dynamic system, the executable graphical model including a first representation format within the graphical modeling environment, and the selected information being represented by a second representation format, different than the first representation format, in the location external to the graphical modeling environment; and automatically incorporate the selected information from the location external to the graphical modeling environment into the executable graphical model, to produce a modified, executable graphical model, the one or more instructions that cause the at least one processor to automatically incorporate, cause the at least one processor to:

identify a file type of the selected information;

compare the file type to a data structure including stored instructions that include parameters for incorporation of a plurality of file types into the executable graphical model;

implement a routine to incorporate the selected information into the executable graphical model, in a manner such that a graphical component in the first representation format in the graphical modeling environment is created in the executable graphical model that represents the selected information from the location external to the graphical modeling environment, based on comparing the file type to the data structure; and incorporate the graphical component into the executable graphical model, based on the routine, to produce the modified, executable graphical model, the graphical component being different than the selected information and being obtained or generated based on the selected information or information referencing the selected information, the graphical component including the selected information or the information referencing the selected information, and where the one or more instructions that cause the at least one processor to incorporate the graphical component into the executable graphical model, cause the at least one processor to add the graphical component to the executable graphical model or link the executable graphical model to the selected information through the graphical component.

17. The non-transitory computer-readable storage medium of claim 16, where the instructions further comprise:

one or more instructions which, when executed by the at least one processor, cause the at least one processor to:

display the executable graphical model in the first representation format within the graphical modeling environment; and receive an indication that the selected information or a reference to the selected information is dragged and dropped into a display of the executable graphical model.

18. The non-transitory computer-readable storage medium of claim 16, where the selected information comprises data, functions, inputs, outputs, tables, data structures, databases, links, sources, sinks, or a reference to data, functions, inputs, outputs, tables, data structures, databases, links, sources, or sinks.

19. The non-transitory computer-readable storage medium of claim 16, where the instructions further comprise:

one or more instructions which, when executed by the at least one processor, cause the at least one processor to:

configure the graphical component by adding at least one port to the graphical component such that the selected information, from the location external to the graphical modeling environment, is accessible to another component of the modified, executable model via the graphical component.

20. The non-transitory computer-readable storage medium of claim 16, where the executable graphical model comprises executable blocks.

21. The non-transitory computer-readable storage medium of claim 16, where the selected information includes one or more files.

* * * * *